United States Patent [19]
Bethurum et al.

[11] Patent Number: 5,548,485
[45] Date of Patent: Aug. 20, 1996

[54] IC CARD RIGIDIZED COVER

[75] Inventors: Gary C. Bethurum, Laguna Niguel; Anthony J. Knights, Irvine, both of Calif.

[73] Assignee: ITT Corporation, New York, N.Y.

[21] Appl. No.: 537,114

[22] Filed: Sep. 29, 1995

[51] Int. Cl.⁶ .................................................. H05K 1/14
[52] U.S. Cl. ........................ 361/737; 361/736; 361/752; 257/679
[58] Field of Search ..................................... 361/737, 728, 361/736, 752, 796, 785; 257/679; 439/44, 74, 62; 174/260, 51; 29/830; 235/492; 364/708

[56] References Cited

U.S. PATENT DOCUMENTS

| | | |
|---|---|---|
| 2,144,332 | 1/1939 | Glaser . |
| 2,454,624 | 11/1948 | Boerger . |
| 2,525,087 | 10/1950 | Young . |
| 2,706,328 | 4/1955 | Karmazin . |
| 3,372,310 | 3/1968 | Kantor . |
| 5,242,310 | 9/1993 | Leung . |
| 5,313,364 | 5/1994 | Omori et al. ............................ 361/737 |
| 5,339,222 | 8/1994 | Simmons et al. ....................... 361/818 |
| 5,386,340 | 1/1995 | Kurz . |
| 5,397,857 | 3/1995 | Farquhar . |
| 5,409,385 | 4/1995 | Tan . |
| 5,414,253 | 5/1995 | Baudouin . |

FOREIGN PATENT DOCUMENTS 2057518  6/1993  Canada .

*Primary Examiner*—Gerald P. Tolin
*Assistant Examiner*—Y. Whang
*Attorney, Agent, or Firm*—Thomas L. Peterson

[57] ABSTRACT

A cover assembly for an IC card includes top and bottom covers (52, 54) with overlapping side rails (70, 80). At each side of the card, a downwardly-extending top side rail (70) lies facewise adjacent to an upwardly extending bottom side rail (80), and a layer (90) of solder is sandwiched between the rails and is bonded to each of them. The solder layer extends along most of the height of each cover side, so the two rails and the solder layer between them serve as a single rigid beam. The cover assembly can be, instead, spot welded at a plurality of locations at each side of the card, to weld the two rails facewise together.

9 Claims, 3 Drawing Sheets

IC CARD RIGIDIZED COVER

BACKGROUND OF THE INVENTION

IC cards are usually constructed in accordance with JEIDA standards, wherein one type of card has a length of 3.370", a card width of 2.126", and a card thickness of 0.190". Each card includes a circuit board with electronic components thereon, a body that includes front and rear connectors (at least the front connector has a row of contacts) and possibly a frame extending between the connectors, and a sheet metal cover assembly. The sheet metal cover assembly preferably extends almost completely around the circuit board, except at the front and rear ends of the board where the front and rear connectors lie. A manufacturer of parts for an IC card supplies the body and cover, while the customer manufacturers the circuit board. The customer, or assembler, mounts a circuit board on the body and mounts the cover assembly around the combination of circuit board and body.

One type of sheet metal cover assembly includes top and bottom covers that each comprises a sheet-like part covering the top or bottom of the card, and a pair of side rails. In one arrangement, the bottom edges of the side rails that extend down from the top cover, abut the upper edges of the side rails that extend up from the lower cover, and the abutting edges are welded together by a laser beam welder. The cost of a laser beam welder is very high, and many smaller customers cannot afford them. If the top and bottom covers could be securely joined with the use of moderate cost equipment, this would benefit smaller assemblers of IC cards. It would be desirable if the sides of the cover assembly had increased strength against deflection, to rigidize the card.

SUMMARY OF THE INVENTION

In accordance with one embodiment of the present invention, an IC card and a method for constructing it, are provided, which enable joining of the top and bottom covers of the cover assembly by the use of equipment of moderate cost, while providing cover sides of increased rigidity. Top and bottom covers each have a sheet-like portion covering the top or bottom of almost all of the circuit board, and have side rails. The top side rails that extend downwardly from opposite sides of a top cover part, lie facewise adjacent to corresponding bottom side rails that extend upwardly from opposite sides of a bottom cover part. A layer of solder is sandwiched between each pair of facewise adjacent rails and is bonded to both of them. The covers are initially supplied with solder layers at their side rails, and the top and bottom covers can be joined by assembling the cover assembly and heating the opposite sides of the cover assembly to melt the solder layers.

The solder layers preferably extend along at least half of the height of each side of the cover assembly. As a result, the combination of adjacent rails with a solder layer sandwiched between them, serves as a thick unitary beam of considerable height, to provide high strength and rigidity. The manufacturer of the cover assembly bonds a solder layer to each side rail face that will lie adjacent to a side rail face of the other cover. The side rails are formed so when assembled they press against each other prior to melting of the solder layers. As a result, all that the assembler must do is assemble the covers and heat the opposite sides of the cover assembly to melt the two abutting solder layers into one another. Instead of soldering each pair of rails together, they can be spot welded together at a plurality of locations at each side of the card.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
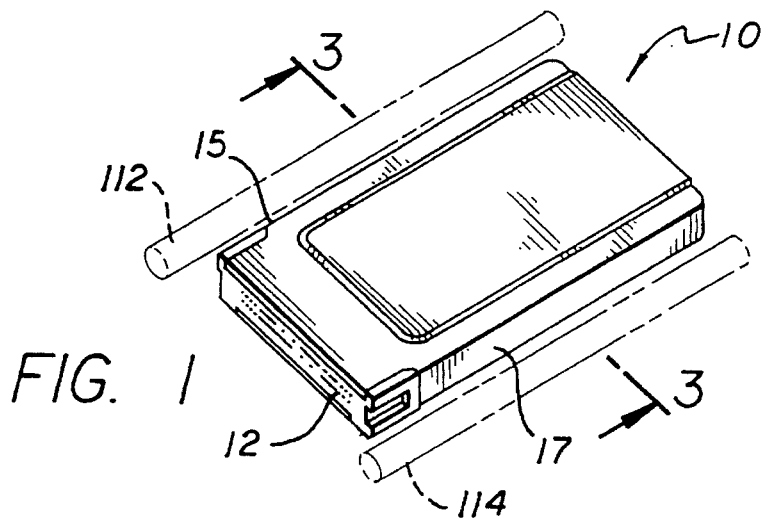
FIG. 1 is an isometric view of an IC card constructed in accordance with the present invention, and indicating, in phantom lines, a method for completing the assembly.
Figure 2:
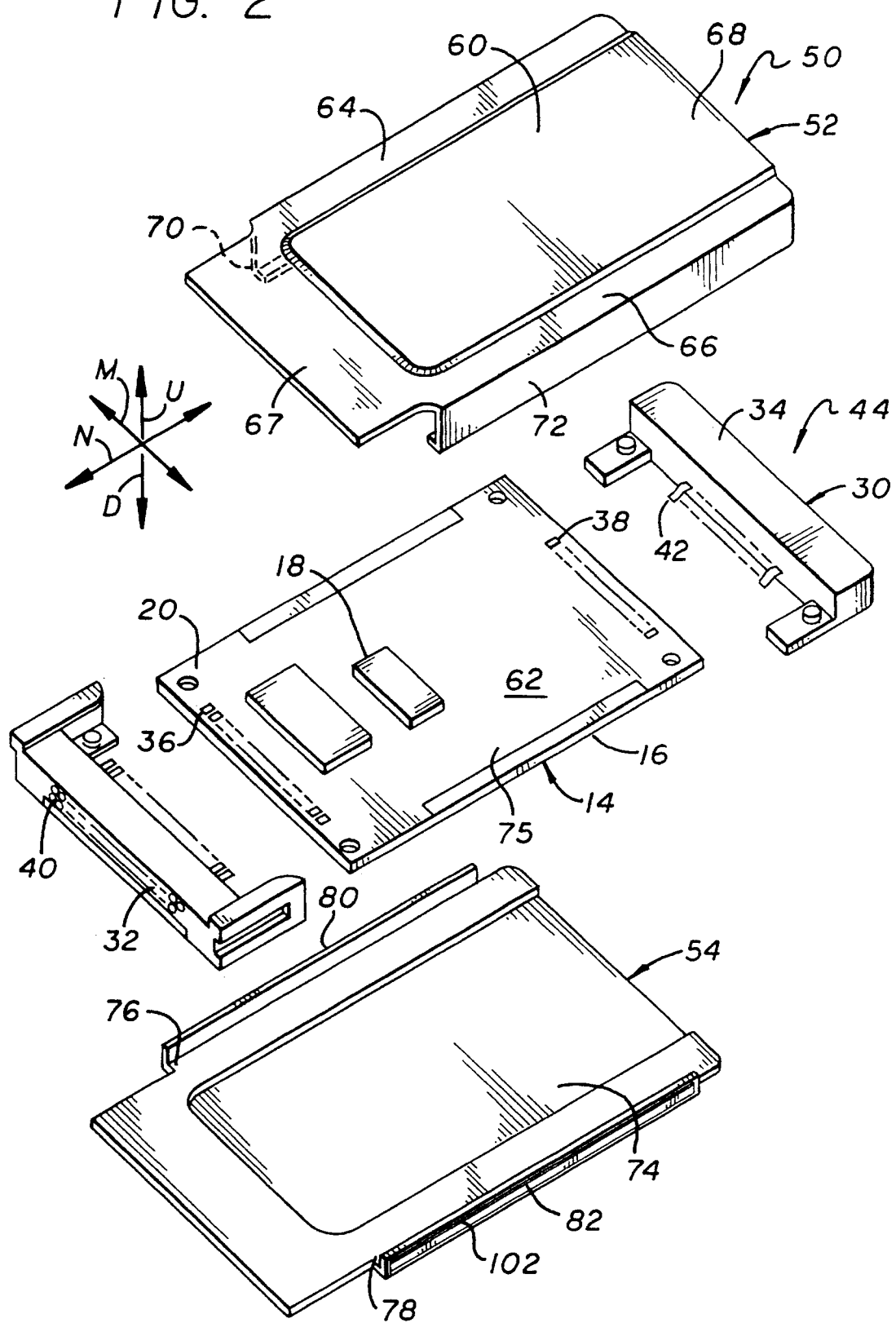
FIG. 2 is an exploded isometric view of the IC card of FIG. 1.

FIG. 1 illustrates an IC card 10 which has a front connector 12 for insertion into an electronic device, to connect to contacts in the electronic device. A cover assembly 50 lying around most of the periphery of the card, has opposite cover sides 15, 17. As shown in FIG. 2, the IC card includes a circuit board assembly 14 comprising a board 16 and electronic components 18 thereon. The board has front and rear ends 20, 22 that are mounted on a body arrangement 30 which is formed by front and rear connectors 32, 34. It may be noted that in some IC cards, the body arrangement includes an additional molded plastic frame that extends between the front and rear connectors, although in the embodiment of FIG. 2, the body includes only the front and rear connectors. The circuit board has a row of contact traces or pads 36, 38 at its opposite ends, which engage tails of the contacts 40, 42. In all cases, the front connector 32 has contacts, but only in some cases does the rear connector 34 have contacts. The combination 44 of the circuit board assembly 14 and body 30, is enclosed by a cover assembly 50.

The cover assembly 50 includes top and bottom covers 52, 54, that are each formed of bent sheet metal, such as stainless steel. The top cover includes a top part 60 that covers substantially all of the top face 62 of the circuit board. The cover top part has laterally spaced (in direction M) opposite sides 64, 66 and longitudinally spaced (in direction N) opposite ends 67, 68. The top cover also includes a pair of top side rails 70, 72 that each extends substantially downwardly (in direction D) from a different one of the top part sides. The bottom cover 54 is similarly constructed, with a bottom part 74 that covers substantially all of the board bottom face 75. The bottom part has opposite sides 76, 78, and has bottom side rails 80, 82 extending substantially upwardly (in direction U) from each side of the bottom part.

Figure 3:
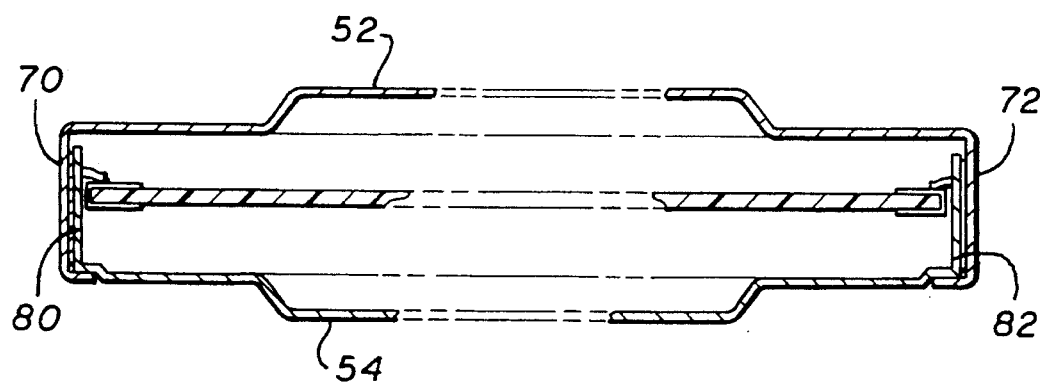
FIG. 3 is a sectional view taken on line 3—3 of FIG. 1.

FIG. 3 shows the top and bottom covers 52, 54 after they have been completely assembled. Each top side rail such as 70 lies facewise adjacent to a corresponding bottom side rail 80, with a considerable overlap between them. As better shown in FIG. 4, a combined layer 90 of solder is sandwiched between the side rails 70, 80 and is bonded to first faces 92, 94 of the rails that face each other. The combined solder layer 90 extends along a height A which is more than half of the cover inside height B at the sides of the cover. As a result, the bonded-together portions of the side rails and solder layer 90 serves as a single beam of considerable thickness, so the beam resists bending in every direction.

Figure 5:
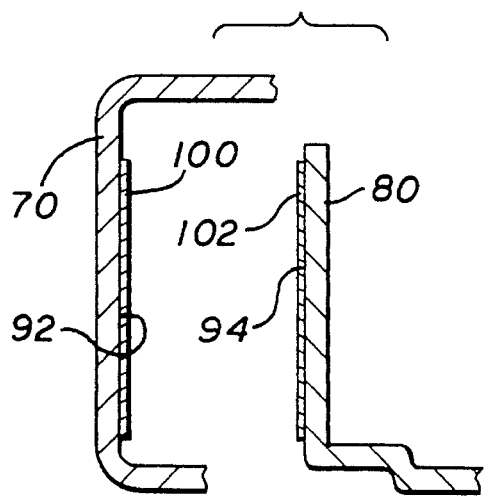
FIG. 5 is an exploded sectional side view of an IC card with the solder layers shown prior to complete assembly, and with the solder layers compression bonded in place.
Figure 7:
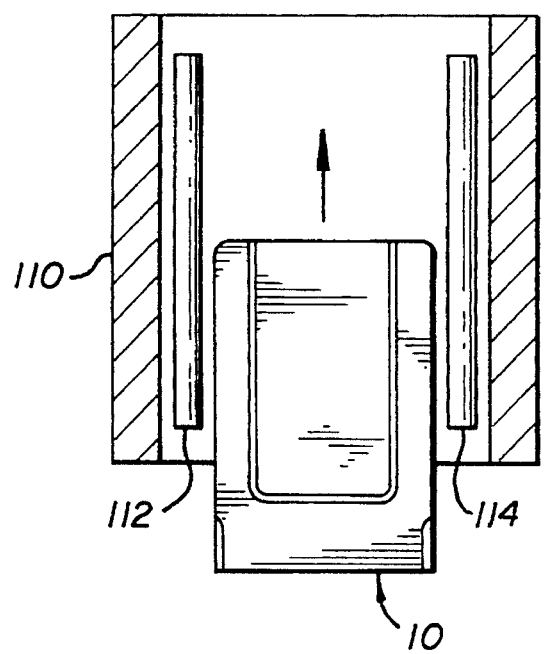
FIG. 7 is a sectional plan view of the IC card of FIG. 1, showing a step in the construction of the card.

FIG. 5 illustrates one arrangement prior to assembly, wherein a first solder layer 100 is crush bonded to the first face 92 of the top side rail 70. Another, similar solder layer 102 is crush bonded to the first face 94 of the bottom side rail 80. The top and bottom covers are preferably constructed so the bottom rails 80, 82 fit within the top rails 70, 72, with the solder layers 102 of the bottom rails pressing against the solder layers 100 of the top rail. The rails are slightly bent when the covers are assembled, as a result on an interference fit. With the top and bottom covers assembled around the circuit board and body, final construction merely requires heating of the opposite sides of the cover. FIG. 7 shows an example, where the IC card 10 is passed through a furnace 110 that includes a pair of heated coils or rods 112, 114. As a card passes through the furnace, the opposite sides of the cover are heated, to melt the solder layers 100, 102 so they melt into each other. When the card is removed from the furnace and cools, the melted-together solder layers solidify. As shown in FIG. 2, each solder layer such as 102, preferably is in the form of a strip that extends along more than half of the longitudinal length of the side rail to which is bonded, and preferably extends along substantially the entire length. All along the soldered-together rails, the solder acts as a seal to protect the inside of the card.

In crush bonding, the solder layers are pressed with high force against the side rails, with the high force resulting in a molecular bond. Since construction by the assembler of the IC cards requires only melting together of two solder layers which are already bonded to corresponding side rails, no solder flux is required to assure good solder bonding to the rails. The solder layers melt into each other without requiring any flux. The simplicity of construction by the assembler allows even a small volume assembler to economically assemble the IC cards.

Figure 6:
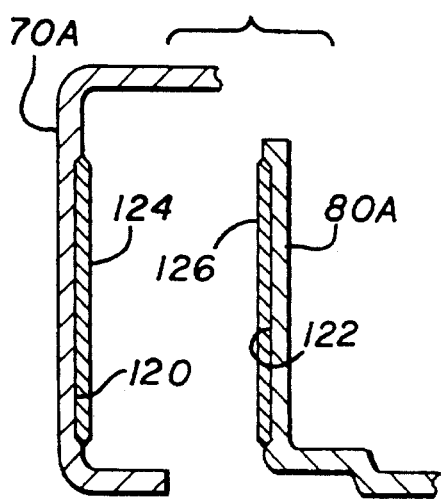
FIG. 6 is a view similar to that of FIG. 5, but in an arrangement wherein the solder layers are inlaid.

FIG. 6 shows another arrangement, where recesses 120, 122 are formed in the side rails 70A, 80A and solder layers 124, 126 have been placed in the recesses and heated as by infrared radiation. It is also possible to plate solder onto the rails, although this is usually more expensive. A moderately low melting temperature solder such as a tin-lead composition which melts at about 250° C. is preferred. However, any material which melts at a low enough temperature (to avoid harm to the circuit board) and which readily bonds to metal, such as the stainless steel of the top and bottom covers, can be used. The solder melting temperature is preferably between about 100° C. and 400° C. to avoid harm to the circuit board during solder melting, while assuring that the solder will not melt during transport or storage of the card under adverse (hot) conditions.

Figure 4:
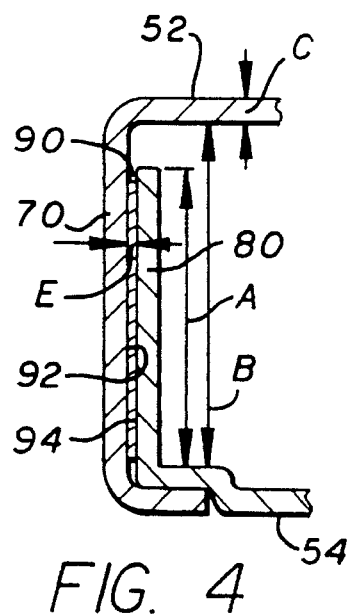
FIG. 4 is an enlarged view of a portion of the IC card of FIG. 3.
Figure 8:
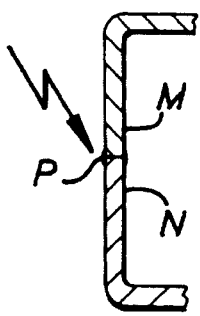
FIG. 8 is a partial sectional view of a prior art cover assembly.

FIG. 4 illustrates a portion of a card that applicant has designed, wherein each cover is formed of stainless steel having a thickness C of 6 mils (1 mil equals one thousandth inch). The solder layer 90 has a thickness E of 1.5 mils. This is accomplished by constructing each original solder layer such as 100, 102 of FIG. 5 with a thickness of about 0.75 mil. The cover inside height B near the opposite sides of the cover, is about 110 mils. The solder layer extends by a height A of about 90 mils. The height A of the solder layer is preferably at least 50% of the cover inside height B near its sides, and is preferably at least 75% of the height B. The greater the height A along which the side rails 70, 76 and solder layer 90 are bonded and act as a unit to provide a thick beam that resists bending, the more rigid the beam. FIG. 8 shows a prior art cover arrangement, wherein adjacent edges of the top and bottom side beams M, N abutted and were laser welded together at their abutment P. As mentioned earlier, such laser welding equipment is very expensive, compared to a simple furnace that merely heats the opposite sides of the card. Also, as described above, applicant's provision of overlapping side rails that are bonded together, results in a beam of increased rigidity, with the effective thickness of the beam equal to the thickness of the two rails plus the thickness of the solder layer that lies between them and that is bonded to them.

Instead of applying a wide, or tall (in directions U, D) solder strip to the side rails, it would be possible to apply perhaps two narrower (or shorter) solder strips, or even numerous dots of solder. However, that would result in forming beams of lesser strength at each side of the card.

Figure 9:
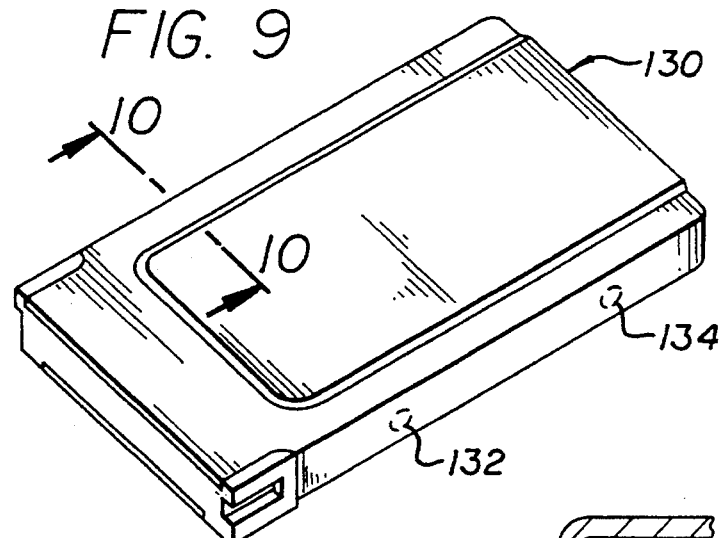
FIG. 9 is an isometric view of an IC card constructed in accordance with another embodiment of invention.
Figure 10:
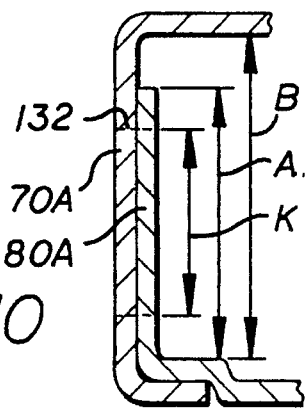
FIG. 10 is a partial sectional view taken on line 10—10 of FIG. 9.

FIGS. 9 and 10 illustrate another cover assembly 130 which is similar to that of FIGS. 1–8, except that the side rails 70A, 80A do not carry solder layers. Instead, the rails are spot welded together by welds 132, 134 at each side of the card. The spot welds such as 132 preferably have a height K of at least half the height A of the bottom rail 80A, and the bottom rail has a height A that is at least half the height B of the inside height of the cover assembly side. Spot welding equipment is much less expensive than laser beam welders (which cost 2.5 to 5 times as much) presently used to join cover halves of IC cards.

Thus, the invention provides an IC card apparatus and a cover assembly therefor, where the cover assembly includes top and bottom covers that can be assembled with low cost equipment and that provide rigid side beams at opposite sides of the card. This can be accomplished by forming the top and bottom covers with side rails that overlap, and by applying a solder layer to a face of each side rail that will lie facewise adjacent to a side rail of the other cover when the covers are assembled. Final assembly is accomplished by merely heating the opposite sides of the cover to melt the solder layers into each other. Each solder layer preferably extends by a height at least equal to one-half the inside height of the cover sides, so the beam provided by the sandwich of two rails and solder layer between them, has a considerable height. The card can be used in any orientation, with terms such as "top" and "bottom" being used herein only to aid in the description of the invention.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An IC card apparatus which comprises a circuit board assembly that includes a board with front and rear ends with said front end having a row of conductive traces, a body arrangement that is fastened to said circuit board and that includes a front connector having a row of contacts engaged with said row of conductive traces, and an electrically conductive cover assembly extending largely around said circuit board and having opposite cover sides, comprising:

said cover assembly includes top and bottom covers, said top cover having a top part that covers most of said circuit board and that has opposite sides at said cover sides, and said top cover having top side rails that each extends substantially downwardly from a different one of said top part sides, said bottom cover having a bottom part that lies below most of said circuit board and that has opposite sides at said cover sides, and said bottom cover having bottom side rails that each extend substantially upwardly from one of said bottom part sides, said top and bottom rails at each of said cover sides lying facewise adjacent to each other to form a pair of facewise adjacent rails;

a pair of layers of solder, each layer of solder lying between the rails of each of said pairs of facewise adjacent rails and bonded to both rails of the pair that it lies between.

2. The apparatus described in claim 1 wherein:

each of said cover sides has a predetermined inside height as measured from the lower surface of a side of said top part to the upper surface of a side of said bottom part;

each of said layers of solder extends along more than 50% of said predetermined height, whereby to provide a wide strong beam construction.

3. The apparatus described in claim 1 wherein:

each of said rails has a recess extending along more than half of the height of the rail and having recess inner walls, and each of said layers of solder is bonded to said recess inner walls.

4. An IC card apparatus for protecting the circuit board of an IC card, comprising:

top and bottom electrically conductive covers, said top cover having a sheet-like top part with longitudinally-spaced opposite ends and laterally-spaced opposite top part sides, and said top cover having a pair of top side rails that each extends substantially downwardly from a different one of said top part sides;

said bottom cover having a sheet-like bottom part with opposite bottom part sides, and said bottom cover having a pair of bottom side rails that each extends substantially upwardly from one of said bottom part sides;

each of said side rails has first and second opposite faces, and said covers are constructed to be assembled with a first face of each top side rail lying facewise adjacent to a first face of each bottom side rail;

a plurality of layers of solder, each bonded to the first face of each of said side rails, whereby to enable construction by assembling said covers and heating their side rails to melt said layers of solder into one another.

5. The apparatus described in claim 4 wherein:

said top and bottom covers are constructed to fit together with said bottom side rails lying between said top side rails, and with each layer of solder on one of said top side rails abutting a layer of solder on one of said bottom side rails, all prior to melting of said solder layers.

6. The apparatus described in claim 4 wherein:

said top side rails each extends by a predetermined height and a predetermined longitudinal length;

said layer of solder bonded to each of said top side rails, extends by a height of at least half said predetermined height and by a length of at least half of said predetermined longitudinal length.

7. A method for constructing an IC card which includes a circuit board assembly including a board having a width and having front and rear ends with said front end having a row of conductive traces, and a body arrangement that is fastened to the board and that includes a front connector having a row of contacts engaged with said row of conductive traces, including:

forming an electrically conductive top cover with a largely horizontally-extending top part having a width greater than that of said board and having opposite sides, with said top cover having top side rails that each extends substantially downwardly from a different one of said top part sides, with said top side rails having inner faces that face each other;

forming an electrically conductive bottom cover with a substantially horizontally-extending bottom part having a width greater than that of said board and having opposite sides, with said bottom cover having bottom side rails that each extends substantially upwardly from a different one of said bottom part sides, with said bottom rails having outer faces that face away from each other;

bonding a plurality of strips of solder to said rails, including bonding a strip of solder to the inner face of each of said top side rails and bonding a strip of solder to the outer face of each of said bottom side rails;

placing said covers so said bottom part of said bottom cover lies under said circuit board arrangement and said bottom side rails lie substantially beyond opposite sides of said circuit board arrangement, and so said top part of said top cover lies over said circuit board arrangement and said top side rails lie beyond said bottom side rails, with the strip of solder on each top side rail abutting a strip of solder on a bottom side rail;

applying heat to said top side rails to melt said strips of solder into one another, and allowing said strips of solder to solidify.

8. An IC card apparatus which comprises a circuit board assembly that includes a board with front and rear ends with said front end having a row of conductive traces, a body arrangement that is fastened to said circuit board and that includes a front connector having a row of contacts engaged with said row of conductive traces, and an electrically conductive cover assembly extending largely around said circuit board and having opposite cover sides, comprising:

said cover assembly includes top and bottom covers, said top cover having a top part that covers most of said circuit board and that has opposite sides at said cover sides, and said top cover having top side rails that each extends substantially downwardly from a different one of said top part sides, said bottom cover having a bottom part that lies below most of said circuit board and that has opposite sides at said cover sides, and said bottom cover having bottom side rails that each extend substantially upwardly from one of said bottom part sides, said top and bottom rails at each of said cover sides lying facewise adjacent to each other to form a pair of facewise adjacent rails;

a plurality of welds at each of said cover sides, each weld joining facewise adjacent locations on one of said top rails and on one of said bottom rails.

9. The apparatus described in claim 8 wherein:

each of said bottom rails extends along a predetermined height A facewise adjacent to one of said top rails, and each of said welds has a height that is at least 50% of said predetermined height.

\* \* \* \* \*